United States Patent [19]

Aschermann et al.

[11] 3,908,172

[45] Sept. 23, 1975

[54] CIRCUIT ARRANGEMENT FOR INFLUENCING FREQUENCY RESPONSE BY ELECTRONIC MEANS, IN PARTICULAR ELECTRONIC TONE CONTROL CIRCUIT

[75] Inventors: Wilfried Aschermann, Hamburg; Paul Bockelmann, Halstenbeck, both of Germany

[73] Assignee: U.S. Philips Corporation, New York, N.Y.

[22] Filed: Nov. 29, 1973

[21] Appl. No.: 420,269

[30] Foreign Application Priority Data

Dec. 19, 1972 Germany .......................... 2262089

[52] U.S. Cl. .................. 330/29; 330/28; 330/30 D; 330/107

[51] Int. Cl.² .... H03G 3/30; H03F 1/08; H03F 3/45

[58] Field of Search ......... 330/29, 30 D, 21, 28, 31, 330/84, 107, 109, 126

[56] References Cited

UNITED STATES PATENTS

| | | | |
|---|---|---|---|
| 3,141,137 | 7/1964 | Greutmann | 330/29 |
| 3,474,347 | 10/1969 | Praglin et al. | 330/30 D |
| 3,684,974 | 8/1972 | Solomon et al. | 330/30 D |
| 3,727,146 | 4/1973 | Hughes | 330/29 |
| 3,731,215 | 5/1973 | Peil et al. | 330/29 |
| 3,790,896 | 2/1974 | Shimizu et al. | 330/29 |

*Primary Examiner*—Stanley D. Miller, Jr.
*Attorney, Agent, or Firm*—Frank R. Trifari; Henry I. Steckler

[57] ABSTRACT

The invention describes an electronic tone control circuit in which the tone can be influenced by means of a direct voltage. The tone control circuit includes two cross-connected differential amplifiers which each have a transistor connected in the emitter lead. The output signal is amplified by means of an operational amplifier. The input signal is applied via impedances to the bases of the transistors connected in the emitter leads which in turn are connected via impedances to the output of the operational amplifier. Depending upon the configuration of the impedance network the application of a direct voltage enables the higher frequencies and/or the lower frequencies to be boosted or attenuated.

14 Claims, 8 Drawing Figures

Figure 1:
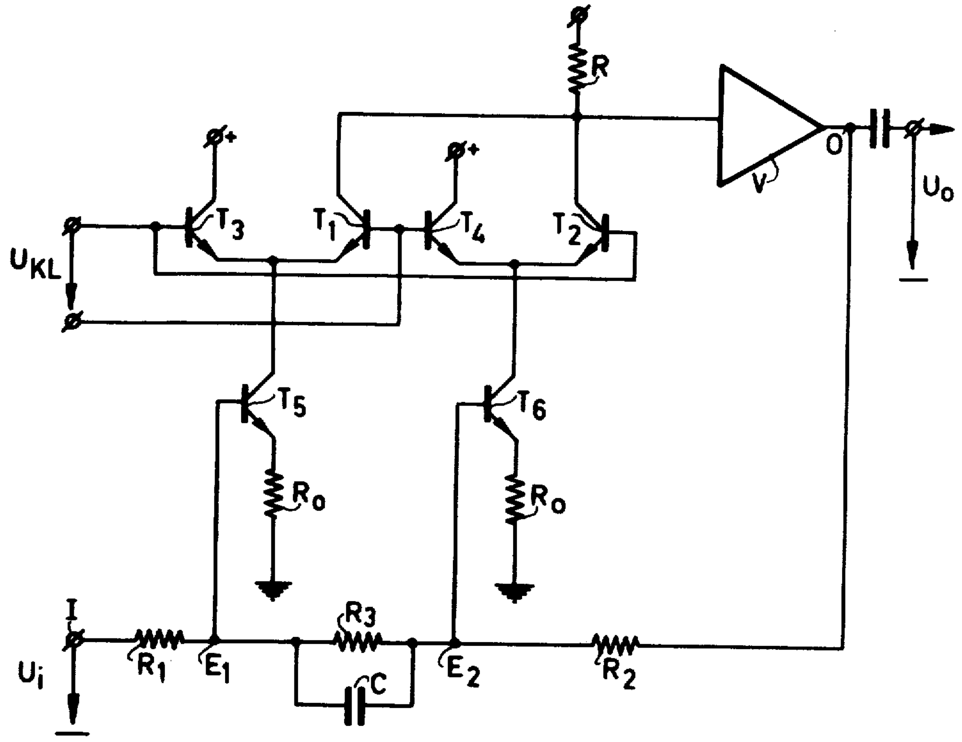

CIRCUIT ARRANGEMENT FOR INFLUENCING FREQUENCY RESPONSE BY ELECTRONIC MEANS, IN PARTICULAR ELECTRONIC TONE CONTROL CIRCUIT

The invention relates to a circuit arrangement for influencing frequency response by electronic means, in particular to an electronic tone control circuit, which includes two amplifiers which have a common output and to the inputs of which is applied the signal the frequency response of which is to be influenced.

A circuit arrangement for correcting frequency response by electronic means is described in British Pat. specification No. 1,215,566. In this arrangement the signal is applied to a summing amplifier via three parallel channels which each include an amplifier provided with automatic gain control, the first channel passing the higher frequencies only, the second channel passing all the frequencies and the third channel passing the lower frequencies only. This circuit arrangement enables the transmission characteristic of the transmission medium, for example a telephone line, to be compensated.

In contradistinction thereto it is an object of the present invention to provide a circuit arrangement of the type referred to such as to enable the user to influence the frequency response in a simple manner by electronic means, i.e. by applying a control voltage, in particular a direct voltage. The circuit arrangement is in particular intended to be used as an electronic tone control circuit in, for example, the low-frequency section of a broadcast or television receiver.

According to the invention this is achieved in a circuit arrangement of the type referred to by a combination of the following features:

a. The gains of the two amplifiers can be varied in opposite senses by means of a control voltage, b. the input signal is applied to the inputs of the two amplifiers via different impedance networks, c. the common output is connected to the inputs of the amplifiers by different negative-feedback impedance networks.

This circuit arrangement may largely be manufactured in integrated-circuit form if in an embodiment of the invention the two amplifiers include transistor differential-amplifier stages the collectors and bases of which are cross-connected, the control voltage being applied between the bases and the input signal being applied to each differential amplifier via an input transistor which is included in the emitter lead of the respective amplifier and the base of which serves as the input thereof.

Such a circuit arrangement provides a 180° phase shift but a comparatively low gain, because the emitter circuits of the input transistors must each include an emitter resistor for reasons of signal compatibility. Since in general a higher gain is required, in an embodiment of the invention the collector voltage of one half of the differential-amplifier transistors is applied to a high-gain amplifier — for example an operational amplifier — which does not produce a phase shift of the signal and the output of which serves as the common output.

In an embodiment of the invention the signal is applied via a first impedance to the input of one amplifier which via a second impedance is connected to the input of the other amplifier which in turn is connected via a third impedance to the common output, the values of the impedances being selected so that the gain of the one amplifier changes in a sense opposite to that of the other amplifier with decreasing or increasing frequency.

As is known, the gain of a high-gain amplifier is equal to the ratio of the impedance between its output and its input to the impedance via which the input signal is applied to its input; hence the aforementioned selection of the values of the impedances must be such that the ratio of the sum of the second and third impedances to the first impedance has a frequency dependence opposite to that of the ratio of the third impedance to the sum of the first and second impedances.

In another embodiment of the invention the inputs of the amplifiers are each connected to the common input by an impedance and to the common output by another impedance, the values of the said impedances being chosen so that the gains of the two amplifiers vary in opposite senses with increasing or decreasing frequency. Such values are obtainable for example by a choice such that the impedance between the common input and the input of one amplifier is equal to the impedance between the common output and the input of the other amplifier.

In another embodiment of the invention, in order to simultaneously increase the gain or the attenuation of the high and low frequencies a resistor is included between the common input and the input of each amplifier, whilst a resistor is included between the common output and the input of one amplifier and an impedance network is included between the common output and the input of the other amplifier. If in a further embodiment of the invention the said impedance network is a band-pass filter which attenuates the high and low frequencies of a signal relative to the mid-band frequencies, and if this circuit is coupled to the volume control so that with decreasing volume the gain of the high and low frequencies is increased, a simple circuit for physiological volume control is obtained. If on the contrary the impedance network is a band-elimination filter having maximum attenuation in the range of the frequencies which determine speech intelligibility an electronically controllable overtone boost filter ("Prasenzfilter") is obtained.

Figure 3A:
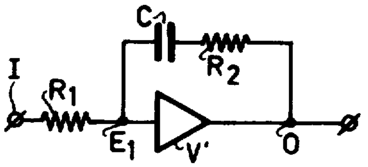
Figure 2:
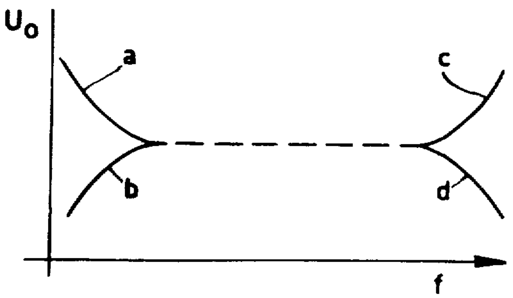
Figure 3B:
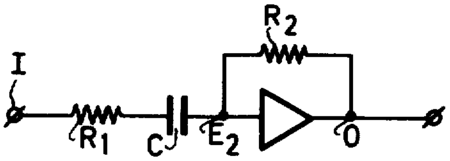
Figure 4:
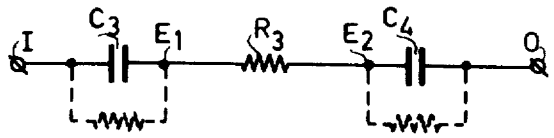
Figure 5:
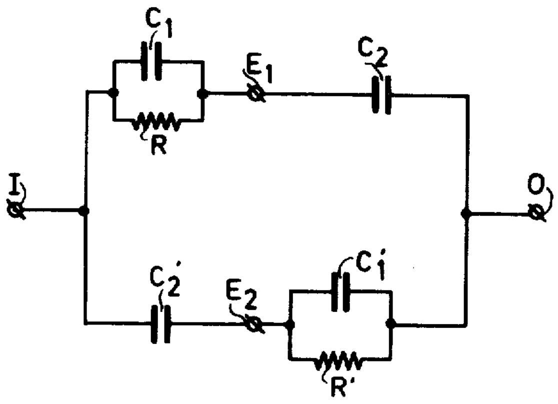
Figure 6:
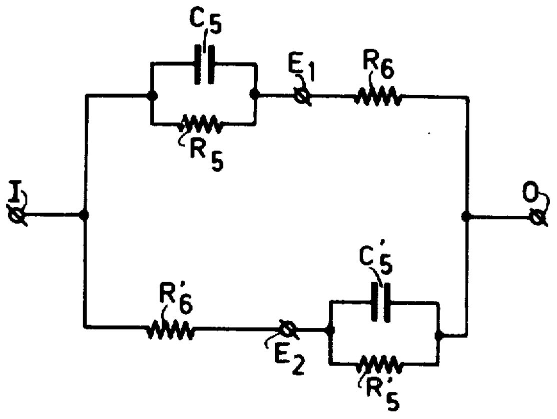
Figure 7:
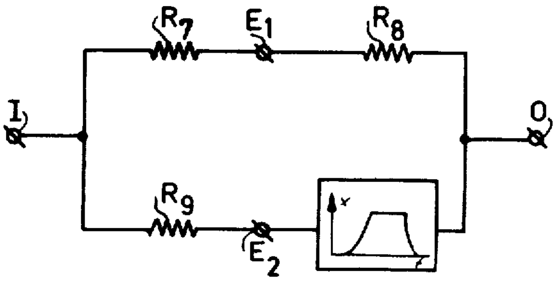

An embodiment of the invention will now be described, by way of example, with reference to the accompanying diagrammatic drawings, in which:

FIG. 1 is a schematic circuit diagram of a circuit arrangement for influencing the low frequencies according to the invention, FIG. 2 is a graph showing the gain as a function of the frequency at various operating conditions, FIGS. 3*a* and 3*b* show equivalent circuit diagrams illustrating the operation of the circuit arrangement of FIG. 1, FIG. 4 shows an impedance network for influencing the high frequencies, FIG. 5 shows an impedance network for influencing the low frequencies, FIG. 6 shows an impedance network for influencing the high frequencies, and FIG. 7 shows an impedance network which permits physiological volume control.

FIG. 1 shows a circuit arrangement according to the invention which may form part of an electronic tone control in an audio-frequency amplifier. The circuit arrangement includes two cross-connected differential amplifiers which each comprise two transistors and are so connected to one another that each of the four transistors $T_1$ to $T_4$ has one electrode in common with each of the three other transistors (for example the collector of the transistor $T_1$ is directly connected to the collector of the transistor $T_2$, the emitter of the transistor $T_1$ is connected to the emitter of the transistor $T_3$ and the base of $T_1$ is connected to the base of $T_4$). A control direct voltage $u_{KL}$ for electronic tone control is applied between the bases of the transistors $T_1$ and $T_4$. The interconnected collectors of the transistors $T_1$ and $T_2$ are connected to a positive operating voltage via a resistor R whilst the interconnected collectors of the transistors $T_3$ and $T_4$ are connected to the positive operating voltage either directly or — for reasons of symmetry — via a resistor of the same value. The signal at the collector resistor R is applied to the input of an amplifier V which has a high gain and does not shift the phase of the signal. The output signal is taken from the output O of the amplifier V via a capacitor $C_0$. The output O is also connected via a resistor $R_2$ of 10 $k\,\Omega$ to the base $E_2$ of a transistor $T_6$ the collector of which is connected to the common emitter connection of the transistors $T_2$ and $T_4$ and the emitter of which is connected to earth through a resistor $R_0$. The input $E_2$ is connected via a capacitor C of 39 nF shunted by a resistor $R_3$ of 150 $k\,\Omega$ to the base $E_1$ of a transistor $T_5$ the collector of which is connected to the common emitter connection of the transistors $T_1$ and $T_3$ and the emitter of which is connected to earth via another resistor $R_0$. The input $E_1$ is connected via a resistor $R_1$ of 10 $k\,\Omega$ to a common input I to which the input signal $u_{IN}$ is applied. The gain at low frequencies can be increased or reduced at will by varying the direct voltage $u_{KL}$ between the bases of the differential-amplifier transistors.

The operation of the circuit arrangement will now be described with reference to FIGS. 2, 3*a* and 3*b*. Assuming that initially owing to the voltage $u_{KL}$ the potential at the bases of the transistors $T_2$ and $T_3$ is negative relative to the potential at the bases of the transistors $T_1$ and $T_4$, then the transistors $T_2$ and $T_3$ are cut off and the transistors $T_1$ and $T_4$ are conducting. The signal $u_{IN}$ applied to the common input I is transmitted via the resistor $R_1$, the transistors $T_5$ and $T_1$ and the differential amplifier V to the common output O. The series connection of the transistors $T_5$, $T_1$ and the amplifier V may be replaced by an amplifier V' which has a high gain and shifts the phase of the input signal by 180°. (In this case the branch including $T_2$ and $T_6$ is cut off). Thus the equivalent circuit shown in FIG. 3*a* is obtained. A resistor $R_3$ of 150 $k\,\Omega$ connected in parallel with a capacitor C is provided for adjusting the direct-current working points of the transistors $T_5$ and $T_6$ and furthermore determines the gain at low frequencies, as will be described hereinafter. At very low frequencies the impedance of the capacitor C is high relative to the resistor $R_3$, so that the negative feedback from the common output O to the input $E_1$ of the equivalent amplifier V' is small; consequently the amplifier has a high gain V $$V = \frac{R_2 + R_3}{R_1}$$

With increasing frequency the impedance of the capacitor C decreases and becomes small relative to the resistors $R_2$ and $R_3$ so that the negative feedback is increased and the gain is reduced. At frequencies exceeding about 250 Hz, which value is determined by the time constant of the capacitor C and of the resistor $R_2$, the impedance of the capacitor C is negligible compared with the resistor $R_2$. Hence the gain is largely determined by the ratio between the resistors $R_2$ and $R_1$. Thus the gain of the circuit shown in FIG. 3*a* varies with the frequency according to the curve *a* of FIG. 2.

If however the voltage $u_{KL}$ is such that the transistor $T_2$ is conducting and the transistor $T_1$ is cut off, the equivalent circuit shown in FIG. 3*b* is obtained. At low frequencies the impedance of the capacitor C is high so that the gain, which corresponds to the quotient of the impedance between the common output O and the input $E_2$ of the amplifier divided by the impedance between the input $E_2$ and the common input I, is very small. With increasing frequency the impedance of the capacitor C is reduced and the gain is increased. Above a limit frequency determined by the time constant $R_1C$ the gain is determined only by the ratio $R_2/R_1$. Thus when $T_1$ is cut off the gain varies according to the curve *b* shown in FIG. 2.

The frequency response between the curves *a* and *b* can be varied by variation of the voltage $u_{KL}$.

If in this circuit the resistors $R_1$ and $R_2$ are replaced by inductors and the capacitor C is replaced by a resistor, a suitable choice of the value of the inductors and of the resistor provides a circuit which also enables the gain between the curves *a* and *b* of FIG. 2 to be electronically influenced.

If, however, the resistors $R_1$ and $R_2$ are replaced by capacitors $C_3$ and $C_4$ respectively and the capacitor C is replaced by a resistor $R_3$ (FIG. 4), a circuit is obtained which enables the frequency response to be influenced above a limit frequency determined by the product $R_3C_3$ or $R_3C_4$ respectively so as to achieve the curves *c* and *d* of FIG. 2. The capacitors $C_3$ and $C_4$ may each have a capacitance of 6.8 nF and the resistor $R_3$ may have a resistance of 10 $k\,\Omega$ . To ensure the supply of direct current to the transistors $T_5$ and $T_6$ resistors of 100 $k\,\Omega$ (shown in broken lines in FIG. 4) may be connected in parallel with the capacitors $C_3$ and $C_4$, which resistors do not influence the alternating-current behaviour, because in this frequency range the impedance of the capacitors $C_3$ and $C_4$ is small compared with the respective shunting resistor.

When the output signal of a circuit arrangement as shown in FIG. 1 is applied to the input of a further similar circuit arrangement in which, however, the impedances $R_1$, $R_2$, and C are replaced by the impedances $C_3$, $C_4$ and $R_3$ as shown in FIG. 4, an electronic tone control circuit is obtained which permits separate bass control and treble control by means of a direct voltage.

If the impedance network shown in FIG. 1 between the common input and output terminals I and O and the amplifier inputs $E_1$ and $E_2$ are replaced by the impedance network shown in FIG. 5, another circuit for influencing the low frequencies is obtained. In this arrangement the common input terminal I is connected to the input $E_1$ by the parallel combination of a capacitor $C_1$ and a resistor R whilst the output O is connected to this input $E_1$ by a capacitor $C_2$. The common input I is connected to the amplifier input $E_2$ via a capacitor $C'_2$ whilst the common output O is connected to this amplifier input by the parallel combination of a capacitor $C'_1$ and a resistor R'. Advantageously: $C_1 = C'_1$, $C_2 = C'_2$ and $R = R'$. Again the capacitors $C_2$ and $C'_2$ each are shunted by a resistor to ensure the supply of direct current to the transistors $T_5$ and $T_6$. The limit frequency below which the frequency response of the gain can be influenced is determined by the time constant $RC_1$ in this arrangement.

If in this circuit arrangement each capacitor is replaced by a resistor and each resistor is replaced by a capacitor, an impedance network as shown in FIG. 6. is obtained which enables the higher frequencies to be influenced. The parallel combination of a capacitor $C_5$ of 1.8 nF and a resistor of 39 $k\,\Omega$ is connected between the common input I and the input terminal $E_1$. A resistor $R_6$ of 39 $k\,\Omega$ is connected between the input $E_1$ and the output O. The parallel combination of a capacitor $C'_5$ of 1.8 nF and a resistor $R'_5$ of 39 $k\,\Omega$ is connected between the common output O and the input $E_2$, whilst the input terminal I is connected to the input $E_2$ via a resistor $R'_6$ of 39 $k\,\Omega$. Since this network passes direct current, separate shunting resistors for the supply of the direct current can be dispensed with.

If the impedance network of FIG. 1 between the terminals I, O, $E_1$ and $E_2$ is replaced by the impedance network shown in FIG. 7 in which a resistor $R_8$ is connected between $E_1$ and O, a resistor $R_7$ is connected between I and $E_2$ and a bandpass filter F which passes mid-frequency signals without attenuation and attenuates the higher and lower frequencies is connected between O and $E_2$, a circuit arrangement for simultaneous boosting of the higher or lower frequencies is obtained.

If in this arrangement $u_{KL}$ is chosen so that $T_1$ is conducting and $T_2$ is cut off, a frequency-independent gain of the value $R_8/R_7$ is obtained. If on the other hand $T_2$ is conducting and $T_1$ is cut off, a high gain is obtained for the high-frequency and low-frequency signals and a smaller gain for mid-frequency signals, because the mid-frequency signals pass through the bandpass filter F without attenuation and hence produce strong negative feedback.

When such an arrangement is combined with an (in particular electronic) volume control so that with reduced volume the transistor $T_2$ is highly conductive and the transistor $T_1$ is weakly conductive, the use of a bandpass filter having a suitable pass characteristic provides an acoustically correct (physiological) volume control.

If in the circuit arrangement shown in FIG. 7 the bandpass filter included between the output O and the input $E_2$ is replaced by a band-elimination filter which attenuates the signals at frequencies which are significant for speech intelligibility in a higher degree than the signals at the remaining frequencies, an overtone boost filter is obtained which in accordance with the polarity and value of $u_{KL}$ is operative in a higher or lesser degree.

If in the circuit arrangement of FIG. 7 the resistor $R_8$ is replaced by a band-elimination filter (or $R_7$ by a bandpass filter), the higher and lower frequencies may be boosted and attenuated relative to the mid-frequencies.

What is claimed is:

1. A circuit arrangement comprising first and second amplifiers, each of said amplifiers having an input and an output; a common output terminal coupled to said amplifier outputs; first and second input impedance networks having different transfer functions, each having an input means for receiving a single input signal and an output coupled to said amplifier inputs respectively; first and second feedback impedance networks for providing negative feedback around said amplifiers respectively, said networks comprising impedance means having different transfer functions, each having an input coupled to said common output terminal an an output coupled to said amplifier inputs respectively; and means coupled to said amplifiers for varying the gain of said amplifiers in opposite senses in accordance with a control signal.

2. Circuit arrangement as claimed in claim 1, wherein the two amplifiers each include a transistor differential-amplifier stage, the collectors and bases of said transistors being cross-coupled between a transistor of one stage to a transistor of another stage, like electrodes being coupled together, the control voltage being applied between said bases, two transistors which are each coupled to one of the emitter leads of said differential amplifier stage transistors and the bases of which comprises said inputs of the amplifiers respectively.

3. Circuit arrangement as claimed in claim 2, further comprising a high-gain amplifier which does not shift the phase of the signal having an input coupled to the collector of two of said differential amplifier transistors and an output which comprises the common output terminal.

4. Circuit arrangement as claimed in claim 1, wherein said first input network comprises a first impedance means for receiving the input signal and coupled to the input of said first amplifier, said second input network and said feedback means comprise a second impedance means coupled to the inputs of said first and second amplifiers, and a third impedance means coupled to the input of said second amplifier and to the common output terminal, the values of the impedance means providing that the gains of the two amplifiers depend upon the frequency of the input signal in opposite senses.

5. Circuit arrangement as claimed in claim 4, said second impedance means comprises a capacitor and said first and third impedance means each comprise a resistor, whereby the low frequencies are influenced.

6. Circuit arrangement as claimed in claim 4, said second impedance means comprises a resistor and the first and third impedance means each comprise a capacitor, whereby the high frequencies are influenced.

7. Circuit arrangement as claimed in claim 1, the values of the impedance means providing that the gains of the two amplifiers vary in opposite senses with increasing frequency and with decreasing frequency respectively.

8. Circuit arrangement as claimed in claim 7 further comprising means for influencing the lower frequencies, said networks including a first parallel combination of a first resistor and of a first capacitor coupled between the input means and the input of said first differential amplifier, a second capacitor coupled between said first amplifier input and said common output terminal, a third capacitor coupled between the input means and the input of said second differential amplifier, and a second parallel combination of a second resistor and a fourth capacitor coupled between said common output terminal and said other amplifier input.

9. Circuit arrangement as claimed in claim 7 further comprising means for influencing the higher frequencies, said networks including a first parallel combination of a first capacitor and a first resistor coupled between the input means and the input of said first differential amplifier, a second resistor coupled between said first amplifier input and said common output terminal, a third resistor coupled between the input means and the input of said second differential amplifier, and a second parallel combination of a second capacitor and a fourth resistor coupled between said common output terminal and said second amplifier input.

10. Circuit arrangement as claimed in claim 1, further comprising means for controlling the higher and lower frequencies, said networks including three resistors, two coupled between the input means and each of the inputs of the two amplifiers respectively, the third coupled between the common output terminal and first amplifier input, and a band filter coupled between the common output terminal and the second amplifier input.

11. Circuit arrangement as claimed in claim 10, wherein said filter is a bandpass filter which attenuates the higher and lower frequencies of said input signal relative to the midfrequencies.

12. Circuit arrangement as claimed in claim 11, further comprising means for providing an acoustically and physiologically correct volume control, wherein the control voltage applied to the differentialamplifier stages so depends upon the volume control that with decreasing volume the gain of the other amplifier is increased.

13. Circuit arrangement as claimed in claim 10 further comprising means for boosting the frequencies which are significant for speech intelligibility, said filter is a band-elimination filter the maximum attenuation of which lies in the range of the frequencies significant for speech intelligibility.

14. Circuit arrangement as claimed in claim 1, further comprising means for controlling the higher and lower frequencies, said means comprising a bandpass filter coupled between the common output terminal and one amplifier input and a band-elimination filter coupled between the common output terminal and the other amplifier input, and a resistor coupled between the two inputs and the input means.

* * * * *